United States Patent [19]

McLevige

[11] Patent Number: 4,712,291
[45] Date of Patent: Dec. 15, 1987

[54] PROCESS OF FABRICATING TIW/SI SELF-ALIGNED GATE FOR GAAS MESFETS

[75] Inventor: William V. McLevige, Plano, Tex.

[73] Assignee: The United States of America as represented by the Secretary of the Air Force, Washington, D.C.

[21] Appl. No.: 741,643

[22] Filed: Jun. 6, 1985

[51] Int. Cl.$^4$ .......................................... H01L 21/283
[52] U.S. Cl. ........................................ 437/27; 357/15; 357/71; 357/141
[58] Field of Search ................. 29/571, 589, 590, 591, 29/578, 579, 580; 148/DIG. 102, DIG. 103, DIG. 104, DIG. 105, DIG. 106; 357/15, 22 I, 22 K, 59 G, 59 I, 71 P, 71 S; 427/84

[56] References Cited

U.S. PATENT DOCUMENTS

| | | | |
|---|---|---|---|
| 4,033,797 | 7/1977 | Dill et al. | 148/187 |
| 4,141,022 | 2/1979 | Sigg et al. | 357/23 |
| 4,182,023 | 1/1980 | Cohen et al. | 29/571 |
| 4,198,250 | 4/1980 | Jecmen | 148/1.5 |
| 4,319,395 | 3/1982 | Lund et al. | 29/571 |
| 4,434,013 | 2/1984 | Bol | 148/1.5 |
| 4,441,931 | 4/1984 | Levin | 148/1.5 |
| 4,568,411 | 2/1986 | Martin | 156/655 |
| 4,574,298 | 3/1986 | Yamagishi et al. | 357/71 |

FOREIGN PATENT DOCUMENTS 52-10672 1/1977 Japan .
53-89374 8/1978 Japan .
56-118370 9/1981 Japan .

OTHER PUBLICATIONS

Ghandhi, S. K., VLSI Fabrication Principles, John Wiley & Sons, 1983, pp. 462–471, 598–605.
Levy et al., "Self-Aligned Submicron Gate Digital GaAs IC", IEEE Electron Devices Letters, vol. ED-L-4, No. 4, Apr. 83, 102–104.
Wittmer, M. "Barren Layers: Principles and Applications in Micro". J. Vac. Sci. Technol. A 2(2), Apr.–Jun. 84, pp. 273–279.
IBM Technical Disclosure Bulletin by H. N. Yu, vol. 14, No. 1, Jun. 1971, p. 244.

Primary Examiner—Brian E. Hearn
Assistant Examiner—T. N. Quach
Attorney, Agent, or Firm—William G. Auton; Donald J. Singer

[57] ABSTRACT

A major difficulty with fabricating GaAs digital logic circuits using enhancement-mode MESFETs has been the large gate-source and gate-drain parasitic resistances inherent in conventional designs. A self-aligned gate process is presented, which incorporates a "mushroom" gate structure for self-aligning both an n+ implant and the source/drain contacts to the gate, thus minimizing the parasitic resistances. The "mushroom" gate consists of a two-layer TiW/Si metallization in which the bottom TiW layer is undercut with a closely controllable chemical etch. The process is compatible with the high temperature anneal necessary to activate ion-implanted GaAs.

11 Claims, 5 Drawing Figures

PROCESS OF FABRICATING TIW/SI SELF-ALIGNED GATE FOR GAAS MESFETS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to an improved metal silicon field effect transistor (MESFET) and method for fabricating that device, and more particularly to a TiW/Si (titantum-tungsten/silicon) gate for GaAs (gallium arsenide) MESFETs.

A widely used field effect transistor in digital logic circuits is the GaAs MESFET. However, a major difficulty with the use of GaAs MESFETs in digital logic circuits as enhancement-mode field effect transistors (E-MESFETs) is the substantial gate-source and gate-drain parasitic resistances inherent in the conventional design. The sheet resistivity of the ungated portion of GaAs E-MESFET channel is approximately 13 k$\Omega$/□. Because of misregistration tolerances necessary for alignment of the gate to the source and drain ohmic contacts, a gate-source and gate-drain spacing of 1-2 microns is typically used, resulting in a high parasitic resistance there. This parasitic resistance can severely limit speed performance in digital logic integrated circuits.

The task of minimizing the gate-source and gate-drain parasitic resistances is alleviated, to some degree, by the prior art technique known as the self-aligned gate process. An example of this prior art process consists of fabricating titanium-tungsten (TiW) gates, and using them as self-aligned masks to implant a heavily doped (n+) region on both sides of the gate.

The implanted GaAs wafer with the TiW gates on it is then annealed to activate the n+ implant, with the result that the ~13 k$\Omega$/□ of the ungated FET channel is reduced to the ~150 $\Omega$/□ of the self-aligned n+ implant. In the prior art process, the spacing between the gate and the source and drain contacts is still limited by alignment tolerances. The use of TiW for the gate metal is necessary to maintain the integrity of the Schottky gate contact during the high-temperature (800° C.) anneal of the n+ implant. Therefore the prior art self-aligned gate process, is inadequate by itself to completely minimize parasitic resistances.

The task of minimizing the gate-source and gate-drain parasitic resistances and their effects is further alleviated by the following prior art patents:

U.S. Pat. No. 4,319,395 issued to Lund et al on Mar. 16, 1982;

U.S. Pat. No. 4,182,023 issued to Cohen et al on Jan. 8, 1980;

U.S. Pat. No. 4,141,022 issued to Sigg et al on Feb. 20, 1979; and

U.S. Pat. No. 4,033,797 issued to Dill et al on July 5, 1977.

The Lund et al, Cohen et al, Sigg et al and Dill et al patents, incorporated herein by reference, all disclose a "mushroom" gate construction. The "mushroom" gate has been used for controlled shortening of gate lengths, but there remains the need for a device and process that will both combine the mushroom gate construction with the self-aligned gate process, as well as select specific materials which are compatible with GaAs MESFET in which the Schottky gate is able to withstand high implant-annealing temperatures of 800°-850° C. The present invention is directed towards satisfying that need.

SUMMARY OF THE INVENTION

The present invention is a TiW/Si self-aligned gate for GaAs MESFETs and a process for fabricating that device.

The GaAs MESFET of the present invention consists of a GaAs wafer, TiW/Si "mushroom" gate, n+ implants, and ohmic contacts on the top surface of both the "mushroom" gate and the n+ implants.

The process, device and selection of specific materials in the present invention comprise a novel solution to the substantial gate-source and gate-drain parasitic resistances inherent in the conventional design. Silicon and titantium-tungsten were specifically selected for use in a two-layered "mushroom" gate which is developed on top of the GaAs semiconductor wafer in a self-aligned gate process. These specific materials withstand the high implant-annealing temperatures of 800°-850° C. while maintaining the integrity of the Schottky gate contact.

The process of the invention is summarized as follows: The first layer of the "mushroom" gate is the titanium-tungsten, which is deposited over the entire top surface of the GaAs wafer by sputtering.

The top layer of the "mushroom" gate is undoped silicon, which is deposited on top of the first layer of TiW by sputtering. After depositing the silicon layer it is doped using phosphorous as the impurity.

With both of the two layers deposited, the "mushroom" gate is patterned using a gate photoresist etching mask which is placed over the silicon layer at the desired dimensions of the top layer of the "mushroom" gate. With the mask in place, the Si is plasma etched with $CF_4/O_2$.

After removing the photoresist mask, the TiW is etched and undercut using $H_2O_2$ to reveal the familiar mushroom shape of the "mushroom" gate. The TiW/Si gate is used as the implant mask as the n+ donor implants are performed and activated by annealing.

Finally, after the source-drain patterns are evaporated onto the top surface of the n+ implants and the top layer of the "mushroom" gate, the self-aligned ohmic contacts are deposited.

It is a principal object of the present invention to provide an improved metal silicon field effect transistor (MESFET) and a method for fabricating that device.

It is another object of the present invention to provide a self-aligned titanium-tungsten/silicon gate for gallium arsenide MESFETs.

It is another object of the present invention to provide a GaAs MESFET with reduced gate-source and gate-drain parasitic resistances.

It is another object of the present invention to provide a GaAs MESFET possessing improved speed performance for use in digital logic integrated circuits.

These together with other objects, features and advantages of the invention will become more readily apparent from the following detailed description when taken in conjuction with the accompanying drawings wherein like elements are given like reference numerals throughout.

DETAILED DESCRIPTION OF THE PREFERRED EMBODIMENT

The present invention is a TiW/Si self-aligned gate for GaAs MESFETs and a process for fabricating that device.

Figure 1:
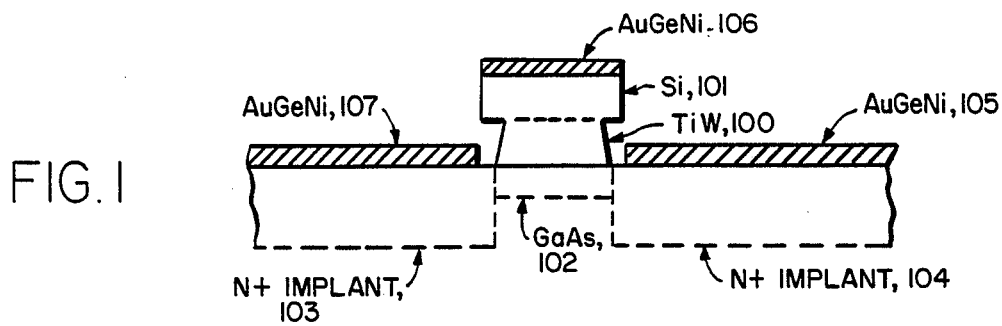
FIG. 1 is an illustration of the preferred embodiment of the present invention.

FIG. 1 is an illustration of the preferred embodiment of the present invention. The self-aligned "mushroom" gate consists of two layers 100 and 101 deposited on the top surface of the GaAs semiconductor wafer 102. The fabrication process of the present invention creates the familiar mushroom shape of the gate.

Adjacent to the GaAs semiconductor wafer 102 are the donor n+ impants 103 and 104. In the preferred embodiment these donor implants are comprised of sulfur, which is deposited using the "mushroom" gate and a mask with the intent that the n+ implants 103 and 104 will diffuse laterally during the anneal under the edges of the "mushroom" gate 100 and 101.

Finally, the source/drain ohmic contacts 105-107 are evaporated directly on top of the gate regions, resulting in self-aligned source and drain contacts. Except for the very small region (0.1-0.2 microns wide) under the edges of the "mushroom" gate, the approximately 150 ohms/square area of the n+ implants 103 and 104, have been replaced with the 3 ohms/square ohmic contact metal 105-107. In the preferred embodiment AuGeNi is used as the ohmic contacts 105-107.

As mentioned above, the concept of the "mushroom" gate is not new. However, part of the novelty of the present invention consists of the selection of the specific materials: titanium-tungsten is used on the lower layer 100 of the "mushroom" gate and silicon is used for the top layer 101. Together, the TiW/Si "mushroom" gate takes advantage of the lateral diffusion, during anealing of the ion-implanted sulfur of the n+ implants 103 and 104 to minimize the gate-source and gate-drain resistances.

One of the major difficulties with the fabrication of enhancement-mode metal silicon field effect transistors (E-MESFETs) on GaAs is the substantial gate-source and gate-drain resistances in the conventional design. The sheet resistivity of the ungated portion of a GaAs E-MESFET channel is approximately 13 kilo ohms/square. Because of misregistration tolerances necessary for alignment of the gate to the source and drain ohmic contacts, a gate-source and gate-drain spacing of 1-2 microns is typically used, resulting in a high parasitic resistance.

When a TiW gate is implanted on a GaAs wafer and annealed to activate the adjacent n+ implants, the result is that the 13 kilo ohms/square of the ungated FET channel is reduced to the approximately 150 ohms/square of the self-aligned n+ implant. However by use of a TiW gate alone, the spacing between the gate and the source and drain contacts is still limited by the alignment tolerances.

The fabrication process, described below, results in a two-layer TiW/Si metallization in which the TiW layer 100 is undercut in a closely controllable chemical etch. The choice silicon for the top layer is made, partially, from the high-temperature stability of WSi. Secondly, the TiW/Si "mushroom" gate takes advantage of the lateral diffusion of the ion-implanted sulfur of the n+ implants during annealing which also helps to minimize the gate-source and gate-drain resistances. Finally, when the source/drain ohmic contacts 105-107 are evaporated directly on top of the gate regions, then except for a very small region of (0.1-0.2 microns wide) under the edges of the mushroom, the approximately 150 ohms/square of the n+ implants 103 and 104 is effectively replaced with the approximately 3 ohms/square resistance of the ohmic contact metal.

Figure 2:
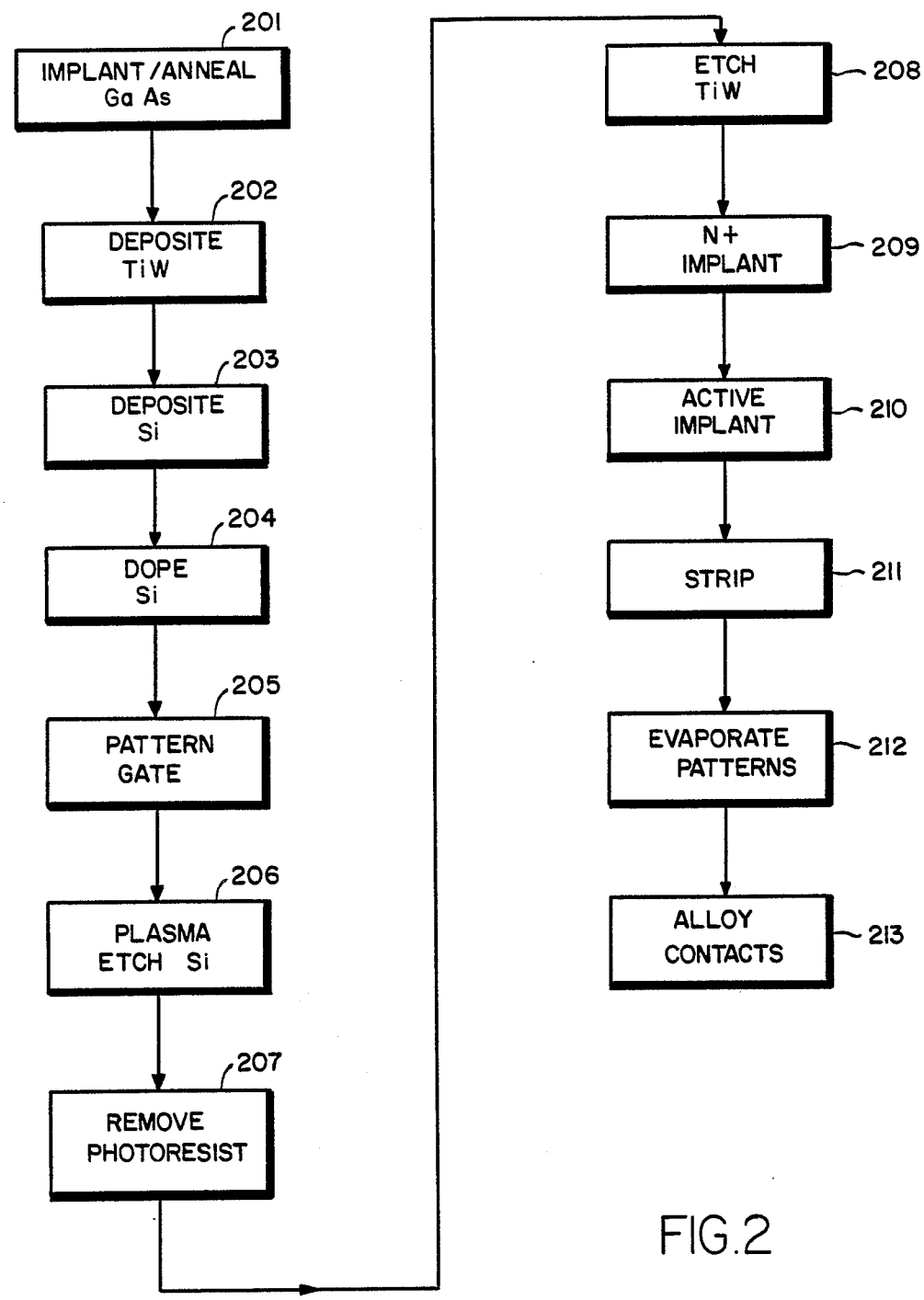
FIG. 2 is block diagram of the process for fabricating the device of FIG. 1.

FIG. 2 is a block diagram of the process for fabricating the device of FIG. 1.

The first step of the process is the Implant/Anneal step 201 in which the top surface of the GaAs wafer 102 is treated with an n-donor as an enhancement channel implant and conventionally annealed to activate the implant.

The second step of the fabrication process is the Deposit TiW step 202 in which the first layer of the mushroom gate is deposited over the entire top surface of the GaAs wafer by sputtering. In the preferred embodiment this first layer is composed of approximately 10% titanium and approximately 90% tungsten.

The third step of the fabrication process is the Deposit Si step 203 in which a layer of undoped amorphous silicon is deposited over the TiW layer by sputtering. As mentioned above, one reason for the choice of silicon for the top layer is due to the high-temperature stability of WSi.

The fourth step of the fabrication process is the Dope Si step 204 in which a phosphorous implant is performed to the Si layer to make it more conductive after the anneal, which is performed later. When the anneal is performed, as part of the later step, the silicon layer becomes more conductive as it is activated and annealed into polysilicon.

Figure 3:
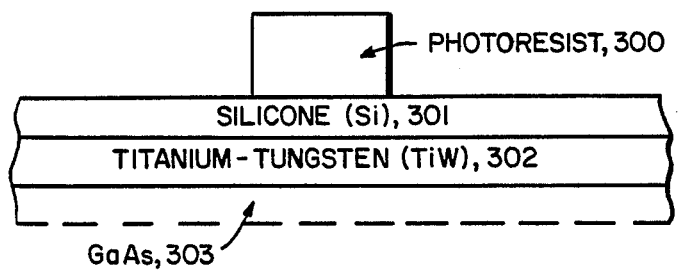
FIG. 3 is a block diagram of step 205 of FIG. 2.

The fifth step in the fabrication process is the Pattern Gate step 205 in which the silicon layer is prepared for etching. FIG. 3 is a block diagram of the Pattern Gate step 205 of FIG. 2. As shown in FIG. 3, a gate photoresist mask, 300 is placed over the silicon layer which covers the entire top surface of the TiW layer 302. The TiW layer 302, in turn, covers the entire top surface of the GaAs wafer 303 which has been activated with an enhancement implant at step 201 of FIG. 2. The photoresist mask 300 should have surface dimensions which equals the desired surface area of the top layer of gate as shown as element 101 of FIG. 1 since the exposed Si will soon be etched away.

Figure 4:
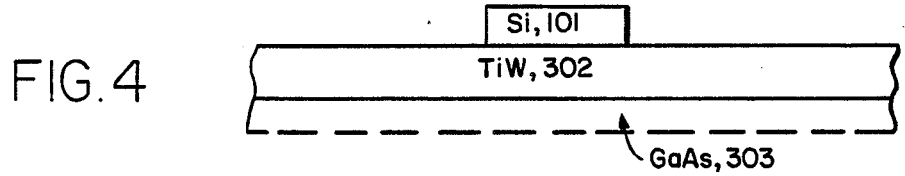
FIG. 4 is an illustration of the desired effect of step 206 of FIG. 2.

The sixth step of the fabrication process is the Plasma Etch Si step 206. FIG. 4 is an illustration of the desired effect of this step as the silicon layer 301 of FIG. 3 is etched away to nearly vertical edges to become the top layer of the gate 101. In the preferred embodiment, the silicon layer 301 is plasma etched using $CF_4/O_2$ at low pressure to obtain the nearly vertical edges. However, note that FIG. 4 just illustrates the desired effect of step 206, but differs from the actual practice of step 206 of FIG. 2 in that the photoresist etching mask 300 is actually removed at the Remove Photoresist step 207.

In the Etch TiW step 208 the TiW layer 302 of FIG. 3 is etched away to become the lower layer of the "mushroom" gate 100 of FIG. 1. In the preferred embodiment of the process a 30% solution of hydrogen peroxide $H_2O_2$ is used to etch the TiW layer with the silicon cap 100 of the mushroom gate serving as the mask. As shown in FIG. 1, the TiW layer is etched away and undercut to reveal the familiar mushroom shape of a "mushroom" gate. $H_2O_2$ was selected since it etch very slowly and is easily controlled and very uniform. The Etch TiW step 208 takes approximately 30 minutes to produce the desired structure.

Figure 5:
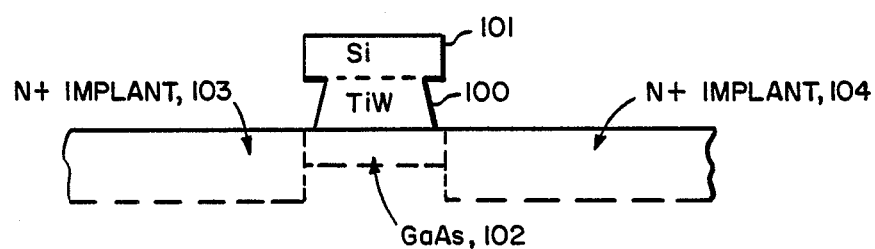
FIG. 5 is an illustration of step 209 of FIG. 2.

The ninth step of the fabrication process is the N+ Implant step 209. FIG. 5 is an illustration of this step in which the n+ implants 103 and 104 are performed. In the preferred embodiment of the process of the TiW/Si gate 100 and 101 serves as the implant mask, and the n+ implant is a donor such as sulfur that diffuses slightly during annealing. Note that the n+ implants 103 and 104 need to be slightly varied to reduce the surface concentration and possible gate shorting problems.

The tenth step of the fabrication process is the Activate Implant step 210 in which the entire GaAs wafer 102, 103 and 104 is encapsulated with $Si_3N_4$ and annealed to activate the implants and also convert the Si to doped polysilicon. The n+ implants 103 and 104 in the GaAs is designed to diffuse laterally during the anneal under the edges of the "mushroom" gate. This process allows self-alignment of both the n+ implants and the source/drain contacts. When the n+ dopants diffuse laterally during annealing, the n+ implant regions 103 and 104 are as depicted in FIG. 1. As shown in FIG. 1, the n+ implant regions 103 and 104 have extended during annealing to align adjacent with the TiW gate 100. This is the "self-aligned" aspect of the present invention. As mentioned earlier, this improvement in the gate-to-source and gate-to-drain spacing reduces gate-source and gate-drain resistances. Also the specific choice of materials (Si on top of TiW) allows the Schottky gate to withstand high implant-annealing temperatures of 800°–850° C.

The eleventh step of the fabrication process is the Strip step 211 in which the $Si_3N_4$ is stripped from the GaAs wafer after the anneal of step 210.

The next step of the fabrication process is the Evaporate Patterns step 212; which allows the source/drain ohmic patterns to be evaporated directly onto the tops of the gate regions. In the Alloy Contacts step 213, the source/drain ohmic contacts 105–107 (of FIG. 1) are evaporated directly on the tops of the gate regions. In the preferred embodiment of the invention the ohmic contacts are composed of AuGeNi.

The above describes a particular self-aligned gate for GaAs MESFETs and the process for fabricating that device.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process of fabricating a metal silicon field effect transistor with a self-aligned mushroom gate from a gallium arsenide wafer, said self-aligned mushroom gate having a lower layer and a top layer, said lower layer being formed from titanium-tungsten and said top layer being formed from silicon, said process comprising the steps of:

forming an enhancement implant on the top surface of said gallium arsenide wafer;

depositing a coating of titanium-tungsten on the top surface of said gallium arsenide wafer;

forming a doped coating of silicon on the top surface of said coating of titanium-tungsten;

forming said top layer of said self-aligned mushroom gate over the center of said top surface of said gallium arsenide wafer from said doped coating of silicon;

forming said lower layer of said self-aligned mushroom gate from said coating of titanium-tungsten;

doping with selected donor implants all areas of the top surface of said gallium arsenide wafer which are not covered by said self-aligned mushroom gate, said selected donor implants being selected from materials, including sulfur, which will diffuse laterally upon annealing;

activating said selected donor implants by annealing them so that they diffuse laterally and reduce any spacing between the donor implants and the lower layer of the self-aligned mushroom gate; and applying source/drain ohmic contacts to the top surface of said self-aligned ohmic gate and said donor implants on said gallium arsenide wafer.

2. A process as defined in claim 1 wherein said depositing a coating of titanium-tungsten step comprises sputtering a mixture of approximately 10% by weight titanium and approximately 90% by weight tungsten over the top surface of said gallium arsenide wafer.

3. A process as defined in claim 2 wherein said forming a doped coating of silicon step comprises the steps of:

sputtering an undoped coating of silicon on the top surface of said coating of titanium-tungsten; and doping said undoped coating of silicon with a phosphorous implant.

4. A process as defined in claim 3 wherein said forming of said top layer of said self-aligned mushroom gate comprises the steps of:

applying a photoresist etching mask over the center of said top surface of said doped coating of silicon;

applying a plasma etch to said top surface of said doped coating of silicon until said doped coating of silicon is etched away except for the area of said coating of silicon under said photoresist etching mask; and removing said photoresist etching mask.

5. A process as defined in claim 4 wherein said plasma etch comprises $CF_4/O_2$.

6. A process as defined in claim 5 wherein said forming said lower layer of said self-aligned mushroom gate comprises the application of an etch solution to said coating of titanium-tungsten until it is etched away except for said lower layer of said self-aligned mushroom gate beneath said top layer.

7. A process as defined in claim 6 wherein said etch solution comprises an approximately 30% solution of hydrogen peroxide.

8. A process as defined in claim 7 wherein said doping with donor implants step comprises the doping of all areas of the top surface of said gallium arsenide wafer which are not covered by the self-aligned mushroom gate with sulfur.

9. A process as defined in claim 8 wherein said activating said donor implants step comprises encapsulating with $Si_3N_4$ and annealing said gallium arsenide wafer at temperatures between 800° and 850° C.

10. A process as defined in claim 9 wherein said applying source/drain ohmic contacts step comprises the steps of:

stripping said gallium arsenide wafer of all $Si_3N_4$; and
evaporating a contact substance directly onto the top surface of said gallium arsenide wafer including the top surface of said self-aligned mushroom gate.

11. A process as defined in claim 10 wherein said contact substance comprises AuGeNi.

* * * * *